United States Patent [19]
Carvalho et al.

[11] Patent Number: 5,291,650
[45] Date of Patent: Mar. 8, 1994

[54] METHOD OF PROVIDING A INTEGRATED WAVEGUIDE COMBINER

[75] Inventors: Ronald M. Carvalho, Boxborough; George H. Stilgoe, Franklin, both of Mass.

[73] Assignee: Raytheon Company, Lexington, Mass.

[21] Appl. No.: 985,098

[22] Filed: Nov. 30, 1992

Related U.S. Application Data

[60] Division of Ser. No. 863,509, Mar. 31, 1992, which is a continuation of Ser. No. 629,858, Dec. 17, 1990, abandoned.

[51] Int. Cl.$^5$ ............................................. H01P 11/00
[52] U.S. Cl. ..................................... 29/600; 330/287; 333/22 R; 333/248
[58] Field of Search .................. 29/600; 333/113, 122, 333/125, 136, 137, 239, 248, 250; 330/287, 295

[56] References Cited

FOREIGN PATENT DOCUMENTS

| | | |
|---|---|---|
| 74-15328 | 4/1974 | Japan. |
| 1179458 | 9/1985 | U.S.S.R. ............................... 29/600 |
| 1420071 | 8/1988 | U.S.S.R. . |

OTHER PUBLICATIONS

Metalloberfläche 32(1978)2 1177–80 by Von O. Tuscher et al.

Primary Examiner—Carl J. Arbes
Attorney, Agent, or Firm—Walter F. Dawson; Richard M. Sharkansky

[57] ABSTRACT

A microwave power combiner includes a first plate having disposed in a first surface thereof a first plurality of grooves and a second plate having disposed in a first surface of said second plate a second plurality of grooves, with said second plate being mated to said first plate and with said first plurality of grooves in the first plate disposed in alignment with the second plurality of grooves in the second plate to provide a plurality of waveguide regions. The waveguide regions are further disposed to provide a plurality of hybrid Ts preferably matched hybrid Ts or magic Ts which are selectively interconnected to form an integrated combiner structure. A first surface of the plate is used to mount a plurality of IMPATT diode modules whereas the second opposite surface of the composite plate is used to mount a heat sink thereby providing a thermal path between the diode modules through the composite plates to the heat sink. In an alternate embodiment, the waveguide regions are provided by casting a plate about a sacrificial mandrel which has the desired configuration of the waveguide regions.

2 Claims, 9 Drawing Sheets

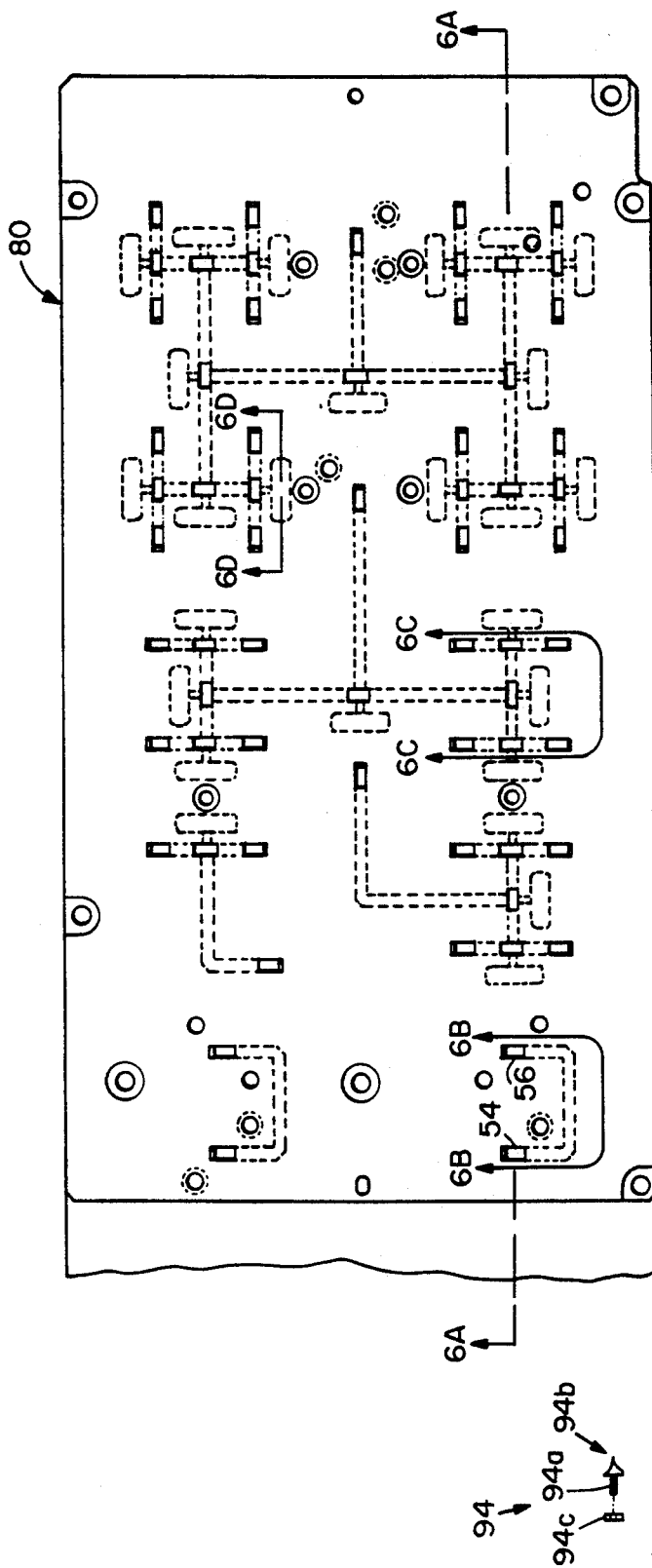
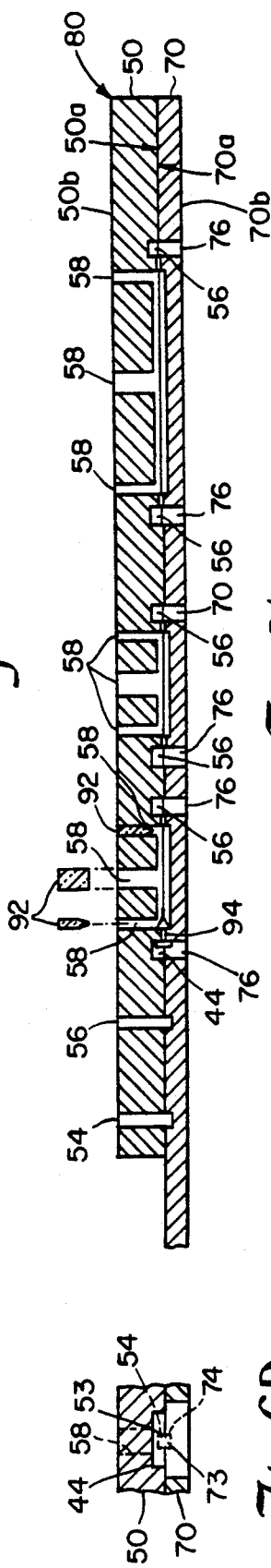
Fig. 6
Fig. 6A
Fig. 6D
Fig. 9

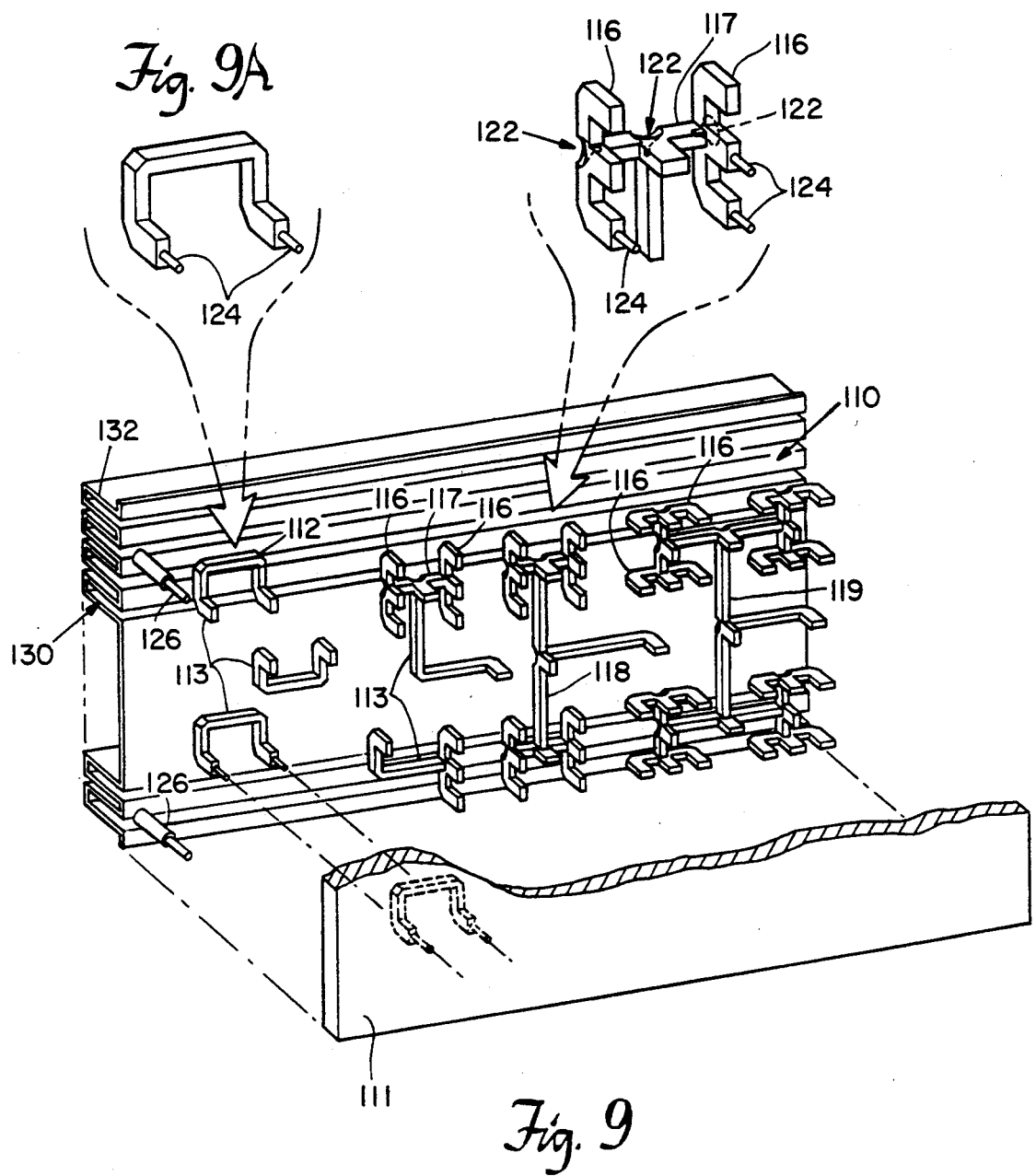

5,291,650

METHOD OF PROVIDING A INTEGRATED WAVEGUIDE COMBINER

This application is a divisional of application Ser. No. 07/863,509 filed Mar. 31, 1992, which is a continuation of application Ser. No. 07/629,858, filed Dec. 17, 1990 now abandoned.

BACKGROUND OF THE INVENTION

This invention relates generally to microwave devices and, more particularly, high power microwave devices.

As is known in the art, a negative resistance diode such as an IMPATT diode is often used as an oscillator or an amplifier to convert DC power to radio frequency power. IMPATT diodes are often employed in radio frequency applications where very high output radio frequency power at very high frequencies and relatively high efficiencies is required. It is also well known that the radio frequency signals provided from such a plurality of IMPATT diodes may be combined together to provide a high power, composite output signal.

One approach used to provide such a high power, composite output signal is to use a common resonant cavity and combine a plurality of IMPATT diode sources together in the common resonant cavity. One such resonant cavity combiner is known as the Kurokawa combiner.

With a Kurokawa combiner, generally a resonant cavity such as, for example, in the shape of a waveguide has a plurality of pairs of diode elements disposed on and coupled through opposing sidewalls of the waveguide combiner.

The above Kurokawa combiner approach is appropriate for many applications, for example, in RF oscillator applications where narrow bandwidth is tolerable since when such IMPATT diodes are combined in the resonant cavity approach, such as the Kurokawa combiner, the IMPATT diodes have relatively narrow frequency bandwidths of operations related to the frequency range over which the impedance characteristics of the diode are appropriately matched to the impedance characteristics of the resonant cavity.

A second approach known in the art for power combining, particularly adaptable for amplifier applications, includes the use of a plurality of hybrid combiners, in particular "magic Ts." As is known, the magic T is a hybrid T having a E-plane arm and H-plane arm and a pair of branch arms. The magic T has a property that a wave entering the H-plane arm will excite equal magnitude waves of like phase in the pair of branch arms and a wave entering the E-plane arm will excite equal waves of opposite phase in the pair of branch plane arms. Due to the geometric symmetry of the device, a wave entering the E-plane arm excites no dominant mode wave in the H-plane arm nor would a wave entering the H-plane arm excite any dominant mode wave on the E-plane arm. If the E- and H-plane arms of the junction are matched, the other two branch arms are also matched. The matched hybrid T is generally referred to as the so called "magic T."

In combining a plurality of IMPATT diode sources to provide a composite output signal as, for example, in an amplifier application the magic T would have a relatively broad bandwidth in comparison to the resonator approach mentioned above. With the magic T approach, generally a pair of IMPATT diode modules with each module having an IMPATT diode or other suitable device which exhibits a negative resistance characteristic appropriately biased to provide microwave power at a particular frequency are coupled to the pair of branch arms of the magic T. One of the E-plane and H-plane arms are used to provide an output port (generally the H-plane arm) for the combined energy and the other one of the E-plane and H-plane arms is terminated in a matching impedance to eliminate backward reflective energy and provide the matched hybrid T. Generally, the magic T is fabricated as a separate microwave component and when a plurality of diode or amplifier modules greater than two are to be combined together each additional pair of diode modules is coupled or combined together by using another discrete magic T. The two pairs of diode modules and their associated magic Ts are further coupled together by using another discrete magic T. The latter discrete magic T is interposed between the two former magic Ts resulting in a structure in which one pair of diode modules lies in a first plane and the second pair of diode modules lies in a second different, generally parallel plane which is spaced from the first plane by the three discrete magic Ts. Additional stages of amplification are provided by successively connecting pairs of IMPATT diode modules together via additional discrete magic Ts and connected such magic Ts together by even more discrete magic Ts.

One problem with the approach mentioned above is that the discrete magic T structures ar often large and expensive to fabricate. In particular, the size of these discrete magic Ts generally increases the overall size of an amplifier or oscillator using such devices. In certain applications, as a solid state microwave signal source in an active seeker of a missile, the size and weight of the signal source should be minimized.

A second, sometimes more important problem, however, is that in high power applications it is generally desirable to heat sink the composite amplifier to ensure that the IMPATT diodes operate at junction temperatures below their specified critical temperatures to prevent damage to the diodes. With the discrete combiner approach described above, since the pairs of IMPATT diode modules are coupled to magic Ts in different planes, this arrangement makes heat sinking of the diode modules relatively difficult since the pairs of IMPATT diode modules are disposed in different planes and the heat paths through each one of the diode modules is through the magic Ts disposed between the pairs of diode modules.

Therefore, heat sinking is accomplished by using a relatively high mass of thermally conductive metal provided by the magic Ts which couple the IMPATT diode modules. However, by increasing the mass of metal between the pairs of IMPATT diode module pairs, this also concomitantly increases the weight and size of the composite amplifier. In many applications for such composite amplifiers, as for example, the solid state source of microwave power in a transmitter of a portable radar as, for example, used in a missile or the like, as mentioned above, such an increase in size and weight is undesirable.

SUMMARY OF THE INVENTION

In accordance with the present invention, a microwave power combiner includes a first plate having disposed in a first surface thereof a first plurality of grooves and a second plate having disposed in a first surface of said second plate a second plurality of grooves, with said second plate being mated to said first plate and with said first plurality of grooves in the first plate disposed in alignment with the second plurality of grooves in the second plate to provide a plurality of waveguide regions. The waveguide regions are further disposed to provide a plurality of hybrid Ts preferably matched hybrid Ts or magic Ts which are selectively interconnected to form an integrated combiner structure. With such an arrangement, by providing first and second plates having first and second plurality of grooves and mating said grooves together to form waveguide regions therebetween, a first surface of the plate may be used to mount a plurality of IMPATT diode modules whereas the second opposite surface of the composite plate may be used to mount a heat sink thereby providing a thermal path between the diode modules through the composite plates to the heat sink. This arrangement is also more compact than those of the prior art.

In accordance with a further aspect of the present invention, a plate has a first surface with a plurality of apertures disposed in said first surface through a portion of said plate and with an interior portion of said plate having a plurality of passages with portions of said passages aligned over the apertures provided in the first portion of the plate and with said passage disposed to provide waveguide paths through the interior portion of said plate. With such an arrangement, a plate having a plurality of waveguide paths is provided. The plate provides a planar surface on which can be mounted various microwave components. These components are then electrically coupled together via the waveguide paths provided by the passageways in the plate. By placing the components over one surface heat sinking through the plate can be accomplished and further the opposing surface of the plate can have a heat sink member which is either integrally formed with the plate or is attached to the opposing surface of the plate.

BRIEF DESCRIPTION OF THE DRAWINGS

The foregoing features of this invention, as well as the invention itself, may be more fully understood from the following detailed description of the drawings, in which:

FIG. 6 is a plan view of the plates of FIGS. 3 and 5 disposed together to provide the integrated combiner structure (shown in phantom) with machine screw apertures being omitted for clarity;

FIG. 6A is a cross-sectional view taken along lines 6A—6A of FIG. 6;

FIG. 6D is a cross-sectional view taken along 6D—6D of FIG. 6;

FIG. 6E is a elevational view of a cone-shaped termination used in the plate of FIG. 6;

FIGS. 9, 9A, and 9B are pictorial isometric views useful for understanding an alternate embodiment of the present invention.

DESCRIPTION OF THE PREFERRED EMBODIMENTS

Figure 1:
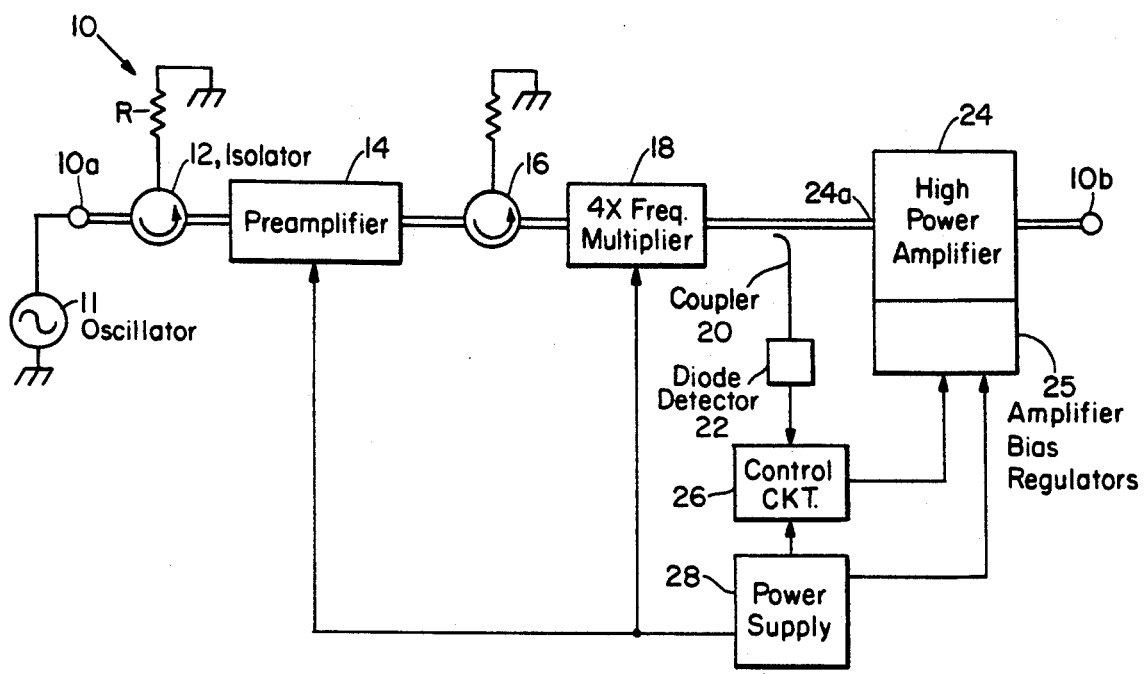
FIG. 1 is a block diagram of an RF amplifier chain particularly adapted for a solid state transmitter for a portable radar.

Referring now to FIG. 1, an amplifier 10 which may, for example, provide a solid state transmitter in a missile, or other application is here shown to include an input terminal 10a which is fed by a low power microwave or RF signal source 11 and a first isolator 12 which has an input port (not numbered) and output port (not numbered) and an isolated port (not numbered) coupled to a matching impedance generally denoted as R. Isolator 12 is here disposed in the amplifier chain 10 to prevent reflections of RF energy back to the oscillator 11 from succeeding stages of the amplifier 10. The isolator 12 has a port coupled to an input of a preamplifier 14, here said preamplifier being a monolithic microwave integrated circuit which provides a predetermined amount of gain to the signal provided at terminal 10a which propagates through the isolator 12 to the preamplifier 14. From the output of the preamplifier 14, a signal is provided to propagate through a second isolator 16, again used to provide interstage isolation and from the output of the isolator 16, the signal is fed to here a frequency multiplier 18.

In the present embodiment, the signal from source 11a is at a relatively low microwave frequency, here 11 gigahertz, and is fed through the MMIC preamplifier stage 14, here tuned to 11 gigahertz and to a frequency multiplier 18, here a 4 to 1 frequency multiplier to provide at the output thereof a low level microwave signal at a frequency of 44 gigahertz. The output from multiplier 18 is fed through a directional coupler 20, as well as to the input 24a of a high power IMPATT diode amplifier 24, as will be further described in conjunction with FIG. 2. The directional coupler 20 samples a relatively small portion of the signal from the output thereof and feeds such sampled signal portion to a diode detector 22. The diode detector circuit 22 provides a signal to bias control circuit 26 which is used to selectively control the bias fed to the amplifier 24. In some embodiments of the amplifier, the stages of the IMPATT diode amplification (not shown) provided in amplifier 24 are conditionally unstable and thus may have a tendency to oscillate weakly in the absence of an applied input RF signal fed to terminal 24a thereof. Accordingly, the path through the diode detector 22 and the bias control circuit 26 are provided to cut off the DC bias power to the amplifier 24 in the event that a signal is not present at the input 24a of the amplifier 24. The transmitter 10 further includes a DC power supply 28 which feeds DC power to circuits 14, 16, and 24 as shown.

Figure 2:
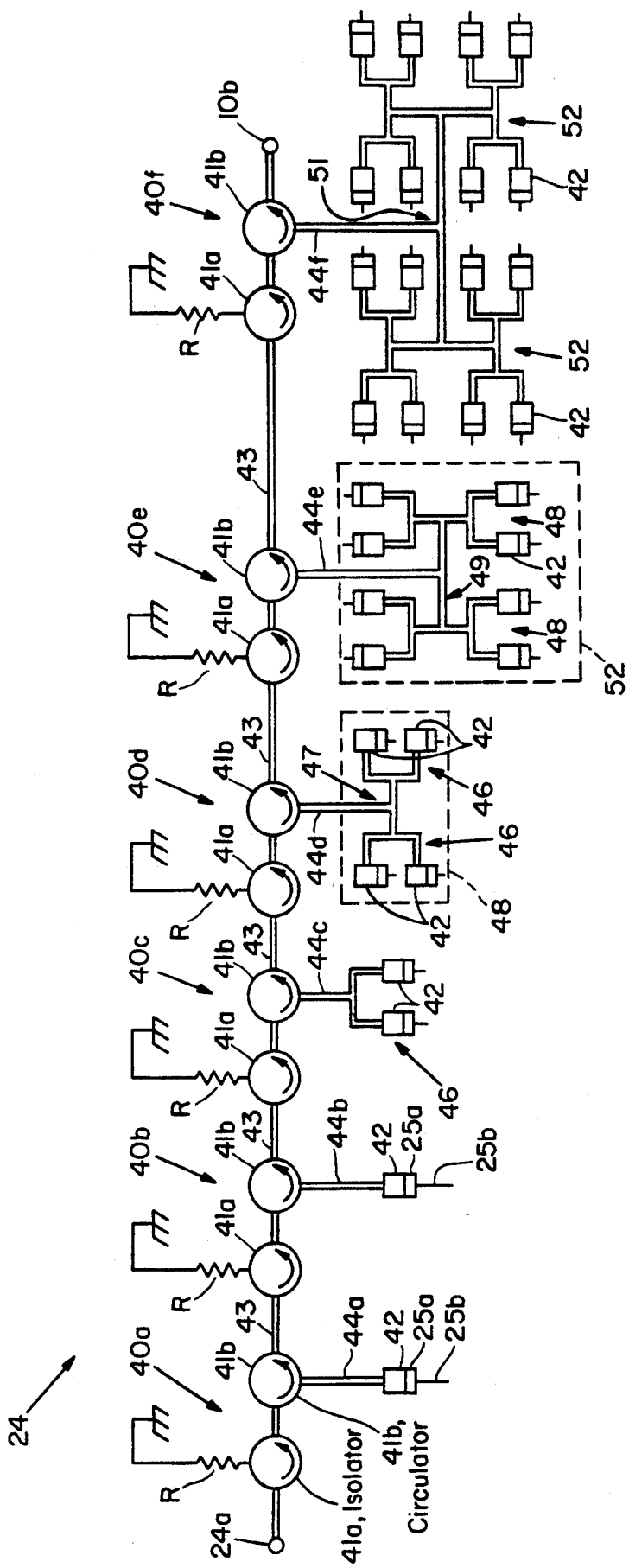
FIG. 2 is a block diagram of a high power amplifier used in the amplifier chain of FIG. 1.

Referring now to FIG. 2, a schematic representation of the high power amplifier 24 generally mentioned in conjunction with FIG. 1 is shown to include a plurality of, here, 6 cascaded stages 40a–40f of amplification. Here, each one of such successively cascade stages 40a–40f includes in combination an isolator 41a to provide interstage isolation and a circulator 41b. To simplify, the following description here each one of the isolators for all the stages 40a–40f is denoted as 41a and each one of the circulators for all of the stages 40a–40f is denoted as 41b. Each isolator 41a has a port (not numbered) terminated in an impedance R, as shown. Each isolator 41a further has an input port (not numbered) and an output port (not numbered) with the input port being fed from a preceding stage and the output port feeding a signal to the input of the corresponding circulator 41b. Circulators 41b each have the aforementioned input port, as well as, a first port (not numbered) which is coupled to the diode amplifiers, as will be described, and a second port which is coupled to a succeeding one of the stages 40b–40f of the amplifier 24, as shown. Suffice it here to say that each of the circulators 41b has a port coupled via waveguide 44a–44f, as shown, to a diode module 42 or to a plurality of diode modules 42 interconnected via magic Ts, as will be described in conjunction with FIGS. 3–6D. Here the first two stages 40a and 40b, are each fed by a single diode module 42 coupled between circulator 41a and module 42 via a corresponding one of waveguides 44a, 44b, as shown. Here stages 40a and 40b have relatively low output power requirements which can be suitably handled by use of a single IMPATT diode module 42. However, subsequent stages 40c–40f have higher output power requirements which must be provided by a plurality of IMPATT diode modules 42 coupled together, as will be described. Diode modules 42 have a bias regulator circuit fabricated on a circuit board (all denoted by 25a) which is affixed to the module 42.) The bias regulator 25a is any conventional DC regulator circuit and is fed a DC bias voltage via line 25b from a power supply 28 (FIG. 1) and provides a regulated bias voltage to bias the diodes (not shown) in module 42. The diode modules 42, in response to an applied RF signal, and the bias voltage provide an RF output signal having higher gain and power than the applied input RF signal. Each of said signals are provided at the same port of the diode module 42.

Still referring to FIG. 2, a succeeding and here third stage 40c of the amplifier 24 is shown having isolator 41a fed from the output port of circulator 41b of stage 40b and with the output port of said isolator 41a of stage 40c feeding an input port of circulator 41b of stage 40c, as also shown. Here one of the ports of circulator 41b of stage 40c is coupled, via a first "magic T" 46 having upwardly bent right angle, outside corner mitered branch ports (not numbered), as will be further described in conjunction with FIGS. 3–6D, to a pair of IMPATT diode modules 42. Here magic T 46 combines the output power from modules 42 and feeds such combined power via waveguide 44c to circulator 41b of stage 40c. The output power from said first three stages is fed to the fourth stage 40d which has a similar arrangement as mentioned in conjunction with stages 40a–40c. Here, however, the circulator 41b of stage 40d is coupled to four IMPATT diode modules 42. The IMPATT diode modules 42 are coupled via two outside corner mitered, right angle, upwardly bent branch ports magic T's 46, as well as a straight non-bent magic T 47, which is coupled via a waveguide 44d to circulator 41b, as shown. The combination of the four IMPATT diode modules 42, two magic T's 46 having the upwardly bent branch ports and the non-bent branch port magic T 47 provide a composite block of diode modules and magic T power combiners denoted as 48.

Stage 40e, likewise, has a similar arrangement of isolator 41a and circulator 41b, as discussed previously. Here circulator 41b has one port (not numbered) fed by eight IMPATT diode modules 42. The eight modules are arranged in a configuration in which two of said composite blocks 48 (as discussed in conjunction with the preceding stage 40c) are coupled together via a non-bent branch port magic T 49, as shown. That is, each block 48 of here four IMPATT diode modules 42 are fed to two inputs (not numbered) of the non-bent branch port magic T 49. The output of magic T 49 is coupled to a waveguide 44e, as also shown. Here the arrangement of the pair of coupled blocks 48 of IMPATT diode modules 42 and non-bent branch port magic T 49 is denoted as block 50.

Here the last stage 40f of the high power amplifier 24 is comprised of a pair of blocks 50, as generally described in conjunction with the preceding stage 40e, with blocks 50 feeding a pair of inputs (not numbered) of a non-bent branch port magic T 51, as shown. An output (not numbered) of the magic T 51 is coupled to the circulator 41b of stage 40f via waveguide 44f, as also shown. Stage 40f has an isolator 41a having a first port (not numbered) fed from preceding stage 40e, a second port feeding circulator 41b of stage 40f', and a third port terminated in an isolating resistance R. The second port of the circulator 41b is fed RF energy from here similar diode modules 42 via from waveguide 44f and the third port of the isolator 41b is coupled to the output terminal 10b of the amplifier 10 (FIG. 1).

In order to provide the amplifier 10, as described in conjunction with FIG. 1 and, in particular, the high power amplifier 24 discussed in conjunction with FIG. 2 in an efficient manner which minimizes thermal impedance between a heat sink and the IMPATT diode modules to thus insure adequate functioning of the amplifier 10, a integrated power combiner plate (not numbered) is used to provide the magic Ts and waveguide paths, as will now be described in conjunction with FIGS. 3–6E.

Figure 3:
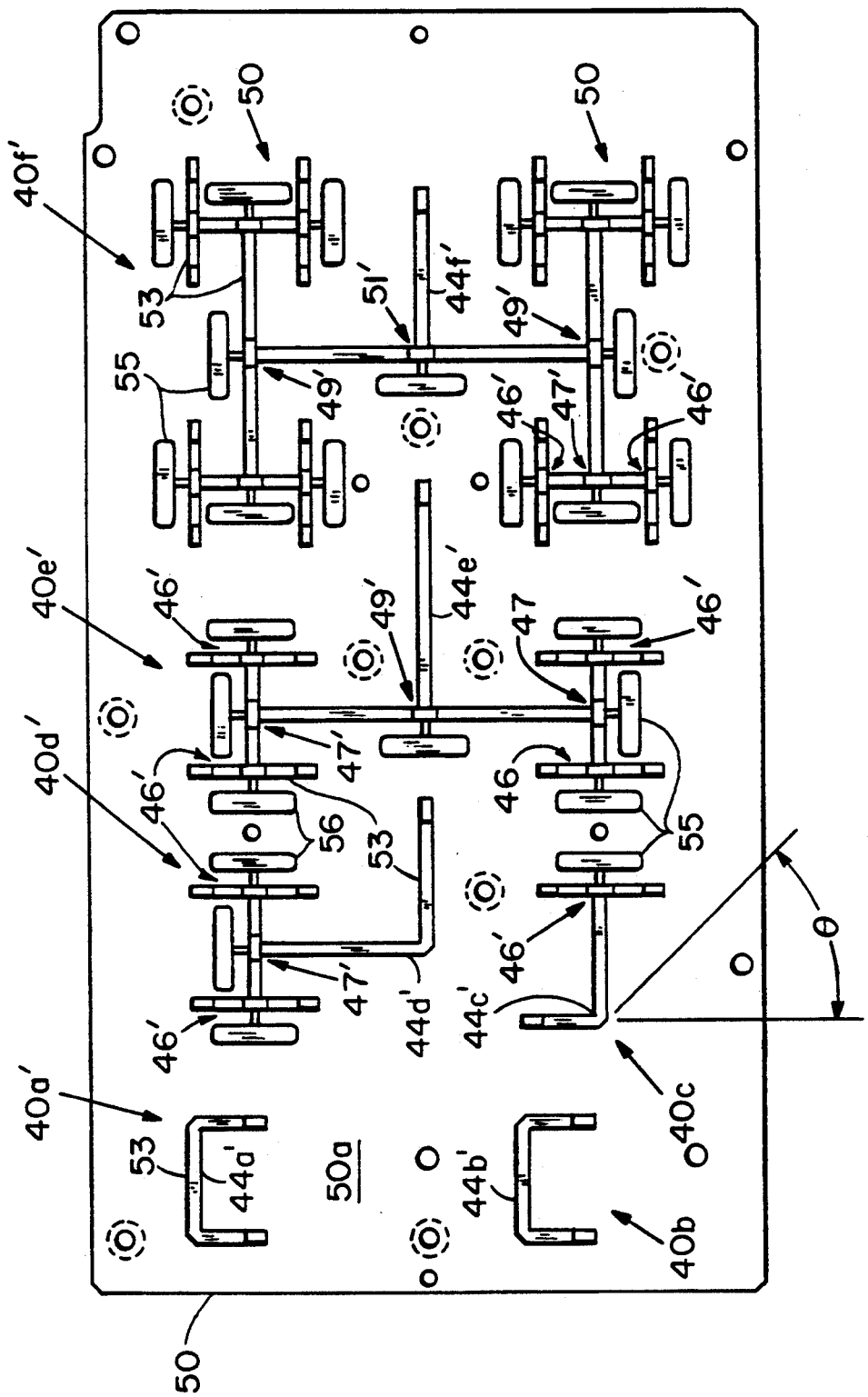
FIG. 3 is a plan view of a first surface of a first plate having grooves disposed in said first surface used to provide integrated magic T combiners in accordance with an aspect of the present invention.

Referring first to FIG. 3, an upper plate 50 of the integrated composite combiner (FIG. 6) is shown having disposed through a portion of a first surface 50a thereof a first plurality of grooves or recesses 53 (selectively numbered) disposed through portions of the first surface 50a of plate 50. Upper plate 50 is here comprised of any thermally and electrically conductive material, preferably highly electrically and thermally conductive materials are used. Examples of suitable materials include aluminum and brass. If aluminum is used, it is protected on all surfaces with a chemical conversion coating or chromate which conforms to MIL-C-5541, class 3 and which is disposed thereon by dipping or other suitable means. Here the grooves or recesses 53 are arranged in appropriate patterns to provide first portions of the microwave waveguide components described in conjunction with FIG. 2. That is, a first portion of the grooves 53 are arranged to provide first portions 46' of the right angle mitered upwardly bent branch port magic T 46 (FIG. 2) as well as first portions 47' of the non-bent branch port magic T 47, first portions 49' of the magic T 49 (FIG. 2), and first portions 51' of the magic T 51 (FIG. 2). Other portions of grooves 53 are arranged to provide first portions 44a'-44f, of corresponding waveguide sections 44a-44f (FIG. 2). The bent waveguide paths, as appropriate, are provided by an outside miter with said outside sidewalls slanted at an angle θ of here 45°, as shown.

Recessed regions 55 (selectively numbered) are further disposed adjacent junction portions of the straight magic T portions 47', 49', and 51', as shown, for providing a region to dispose cone-shaped energy distribution members (not shown), as will be further described in conjunction with FIG. 6. As generally shown in FIG. 3, the patterned regions are used to provide the magic T portions and waveguides of the combiner circuitry described in conjunction with FIG. 2. The regions are mechanically isolated from one another and electrically coupled together by the use of the isolator/circulator assemblies, also described in conjunction with FIG. 2 and the details of which will be described below.

Figure 4:
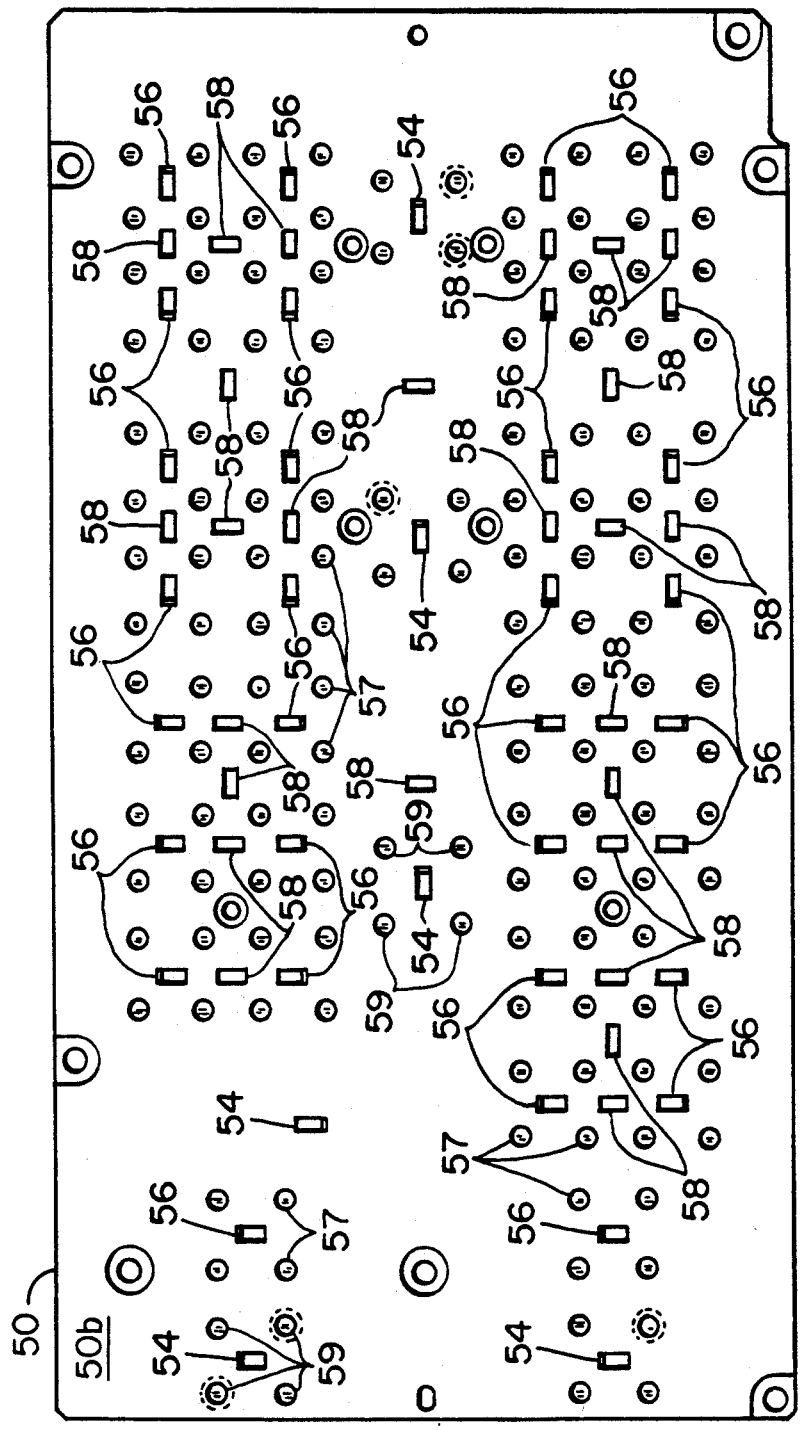
FIG. 4 is a plan view of an opposing, second surface of the plate shown in FIG. 3.

Referring now to FIG. 4, the plate 50 has shown disposed in a second opposing surface 50b thereof a plurality of rectangular apertures, here with apertures 54 providing input/output ports for connections to isolator/circulator members (FIG. 2), apertures 56 providing input/output ports to interconnect diode modules (not shown) and ports 58 used to insert loads (not shown) to terminate magic T's 46, 47, 49, and 51 (FIG. 2) in their matching impedances. The pathways through the plate 50 (not numbered) provided from apertures 54 or 56 through the plate 53 terminate at respective portions of the grooves 53 with an outside corner miter wall (as depicted in FIG. 6A). The apertures 54 and 56 provide termini of upwardly bent pathways (not numbered) to permit RF energy to be fed to or from the top surface 50b of plate 50. Surface 50b of plate 50 further has disposed therein threaded apertures 59 (selectively numbered) through which are provided machine screws or bolts to secure in place diode modules (not shown), as will be further described in conjunction with FIG. 8. Likewise, provided in surface 50b are apertures 59 (selectively numbered) used with screws to secure isolator/circulator circuits, as also will be further described in conjunction with FIG. 8.

Figure 5:
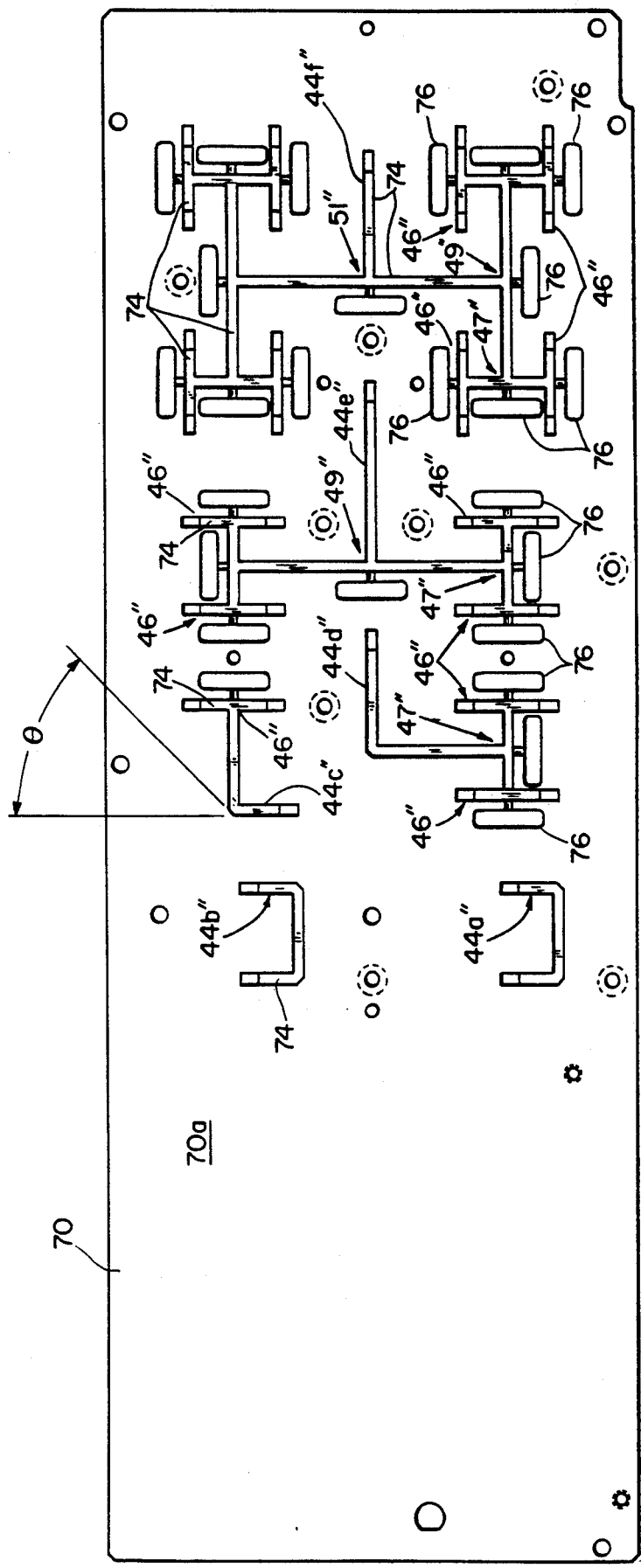
FIG. 5 is a plan view of a first surface of a second plate used for providing the integrated combiner structure.

Referring now to FIG. 5, a second plate 70 is shown having a first surface 70a and having disposed in said first surface 70a a second plurality of grooves 74. The grooves 74 are arranged to provide second portions of the microwave components described in conjunction with FIG. 2. As mentioned in conjunction with FIG. 3, bottom plate 70 is also comprised of thermally and electrically conductive materials such as aluminum or brass and is, in general, the same as that selected for plate 50. That is, a first portion of the grooves 74 are arranged to provide second portions 46" of the right angled mitered upwardly bent branch port magic T's 46 (FIG. 2), as well as, second portions 47" of the non-bent branch port magic T 47 (FIG. 2), second portions 49" of the non-bent branch port magic T 49 (FIG. 2), and second portions 51" of the non-bent branch port magic T 51 (FIG. 2), as shown. Other portions of grooves 74 are arranged to provide second portions 44a"-44f" of corresponding waveguide sections 44a-44f (FIG. 2).

Recessed regions 76 (selectively numbered) are further disposed adjacent junction portions of the straight magic T portions 47", 49", and 51", as shown, to provide a region for disposing a cone-shaped tuning member, as well as, a tightening nut (not shown) and tightening hardware and as will further be described in conjunction with FIG. 6. Here said recessed regions 76 are apertures disposed completely through the plate 70. Suffice it here to say that the patterned regions are here used to provide the magic T portion and waveguides of the combiner circuitry described in conjunction with FIG. 2. Such regions are isolated from one another and electrically coupled together by use of the isolator/circulator assemblies also described in conjunction with FIG. 2 and the details of which will be described further below.

Thus, at this point suffice it to say that plate 50 and plate 70 are fabricated with the recessed groove portions 53, 74, recesses 54, 56, and 58 and apertures 76 using conventional machining techniques. When the plates 50, 70 are mated together, as will be further described in conjunction with FIG. 6, the respective grooves 53, 74 provide waveguides that have selected electromagnetic propagation characteristics. The exact dimensions of grooves, that is, their length, width, height, and depth would depend upon the microwave function to be implemented (i.e. a combiner, waveguide path, hybrid, etc.) the frequency to be propagated, as well as, the desired mode of propagation. Such requirements would be apparent to one of ordinary skill in the art. Further details of construction of the mitered outer corner, as well as, the grooves will be provided in conjunction with FIG. 6A–6E.

Referring now to FIG. 6, the assembled combiner plate 80 is shown having upper plate 50 coupled to lower plate 70 in such a manner as the grooves 53 in upper plate 50 are aligned with corresponding grooves 74 provided in the lower plate 70 to provide the microwave components here waveguides, and magic Ts, as generally described in conjunction with FIG. 2. Apertures 56 provided in upper plate 50 are also aligned with corresponding ends of selected ones of the grooves 53 provided in plate 50 to form orthogonal non-planar waveguide ports to couple diode modules 42 to the magic Ts as described in conjunction with FIGS. 2 and 4. Correspondingly, apertures 54 provided in upper plate 50 are also aligned with end portions of selected, different portions of grooves 53 to provide orthogonal, non-planar waveguide ports for the circulators, as described in conjunction with FIGS. 2 and 4.

Figure 6B:
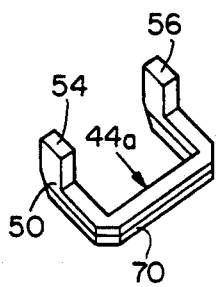
FIG. 6B is a pictorial, isometric view taken along line 6B—6B of FIG. 6.

As an illustrative example of how plates 50 and 70 are disposed together to provide waveguide regions, consider the waveguides depicted in FIG. 6B which is used to interconnect the first stage 40a between its circulator, which is disposed over port 54, to a diode module disposed over port 56. The waveguide path is provided by portions of the plates 50 and 70 as pictorially depicted in FIG. 6B. The port 56 will be coupled to a corresponding port at the output of the circulator 41b (FIG. 2) whereas the port 54 would be coupled to an input/output port of a diode amplifier module 42 (FIG. 2).

Figure 6C:
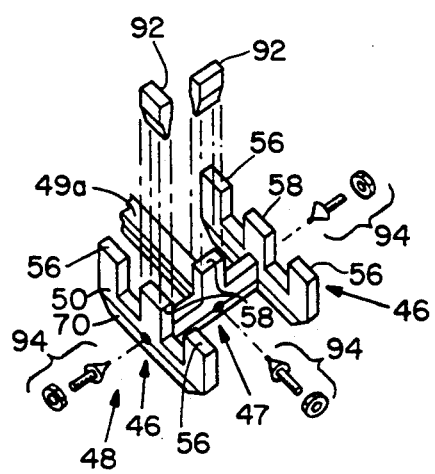
FIG. 6C is a pictorial, isometric view taken along line 6C—6C of FIG. 6.

As a further illustrative example, consider the combiner arrangement depicted in FIG. 6C. Here this combiner arrangement corresponds to one of the blocks 48 of the stage 40e which will have four diode modules coupled together in said block 48. Here the block 48 includes two right angle mitered upwardly bent branch port magic T's 46 each having a pair of upwardly bent branch ports 56 which provide port connections at the upper surface 50b of plate 50 for diode modules (not shown), a terminated port terminated at aperture 58 on upper surface 50b of plate 50, and an output port coupled to one of the corresponding pair of branch ports of a non-bent branch port magic T 47. Magic T 47 has one port, the E-plane port, terminated at an aperture 58 and has a second port, the H-plane port, coupled to a waveguide section 49a which is part of the magic T 49 depicted in FIG. 2. The block 48 is shown to further have terminations 92, here tapered terminations as known to one of ordinary skill in the art, disposed to be placed into apertures 58 to terminate the ports 58 of the magic T's 46, 47, and thus provide matched hybrid couplers or magic Ts.

Cone-shaped energy distribution assemblies 94 are also shown (FIG. 6E) disposed through portions of the combiners 46 and 47 with the pointed portion of the cone assembly 94 disposed at the junction of the magic T. Such an arrangement is used to provide an equi-distribution of incident energy to each of the pair of branch arms of the respective magic T. They are comprised of a suitable metal such as aluminum or brass. Here the cone 94 has a flat bottom surface (see FIG. 6E) which is disposed flat against the base of the waveguide floor (not shown). The wide portion of the cone 94b is further disposed flat against the vertical walls of the waveguide as will now be apparent to one of ordinary skill in the art.

Preferably, the cone-shaped tuning assemblies 94 are disposed within recesses 76 provided in the plates 70, as generally depicted in FIG. 6A prior to mating of the plates 50 and 70. That is, the cone assemblies 94 are connected to the bottom plate 70 and the upper plate is then connected to the bottom plate and final tightening of the screw portion 94a of the assembly 94 is made using a small wrench or other suitable means to tighten a nut 94b. Accesses to the nut is provided after the plates are assembled together through the holes 76 and recessed portions 44 of plates 70 and 50, respectively.

As depicted in FIG. 6D, small rectangular recessed portions 53 and 73 are provided in plates 50 and 70, respectively, in the regions where such plates combine together and through which the cone tuning assembly 94 is disposed to provide a region to receive threaded shaft portion 94a of the assembly 94 with the point 94b of the cone assembly 94 providing the equi-energy distribution arrangement within the junction of the respective magic T. The rectangular regions 53 and 73 are thus machined in the small regions through the small groove which couples the access hole 76, 56 to the respective magic T.

The patterns provided in the combiner plate 80 are arranged such that the partition or the interface between the upper plate 50 and the lower plate 70 occurs in a portion of the waveguide channels where the current in the waveguide is at a minimum of typically zero. That is, since the configuration described in conjunction with FIG. 6 uses the H-plane arms of the magic Ts as signal ports with the E-plane arms of the magic Ts being terminated in characteristic impedances, the interface is located where the current distribution through the waveguide is a null. At this location the interface between the two plates is located to minimize electrical discontinuities. With this particular arrangement, when the lower and upper plates are secured together, the interface which forms between the two plates will have a minimal effect on the propagation of microwave energy within the waveguides since the interface will be at the zero current point within the waveguide.

With the mitered magic Ts 46 which have the branch arms bent upwards to terminate at ports 56 on the upper portion 50a of upper plate 50, as described above, the outer walls of the arms are mitered as shown. The mitered outer wall extends from the lower plate 70 into a small portion of the upper plate 50. As would be apparent to one of skill in the art, when the dimensions of the waveguides are selected in accordance with the frequency to be propagated in the waveguide, and when the mitered outer wall is provided in the waveguide a portion of the mitered wall portion extends beyond the interfacial boundary between the upper and lower plates 50, 70 and thus the upper plate 50 will have a small mitered portion of that wall machined in the grooves provided in the plate 50 as shown in FIG. 6B.

Thus, the combiner 80 is provided by machining half of a waveguide configuration into each of two mating plates and then mechanically fastening the plates together with the machine portions aligned. The cones are also fixed in place prior to mating the plates 50, 70, together. The cones 94 are secured with the nut after the plates are mated together. Generally to insure optimum performance, a matched set of parts is provided for each one of the combiner plates. Electrical discharge machining procedures are used to create the right angle H-plane bends in the combined waveguide assembly as shown in FIG. 3. As mentioned above, a small portion of the bend occurs in the upper plate while the majority of the bend resides in the lower plate.

Figure 7:
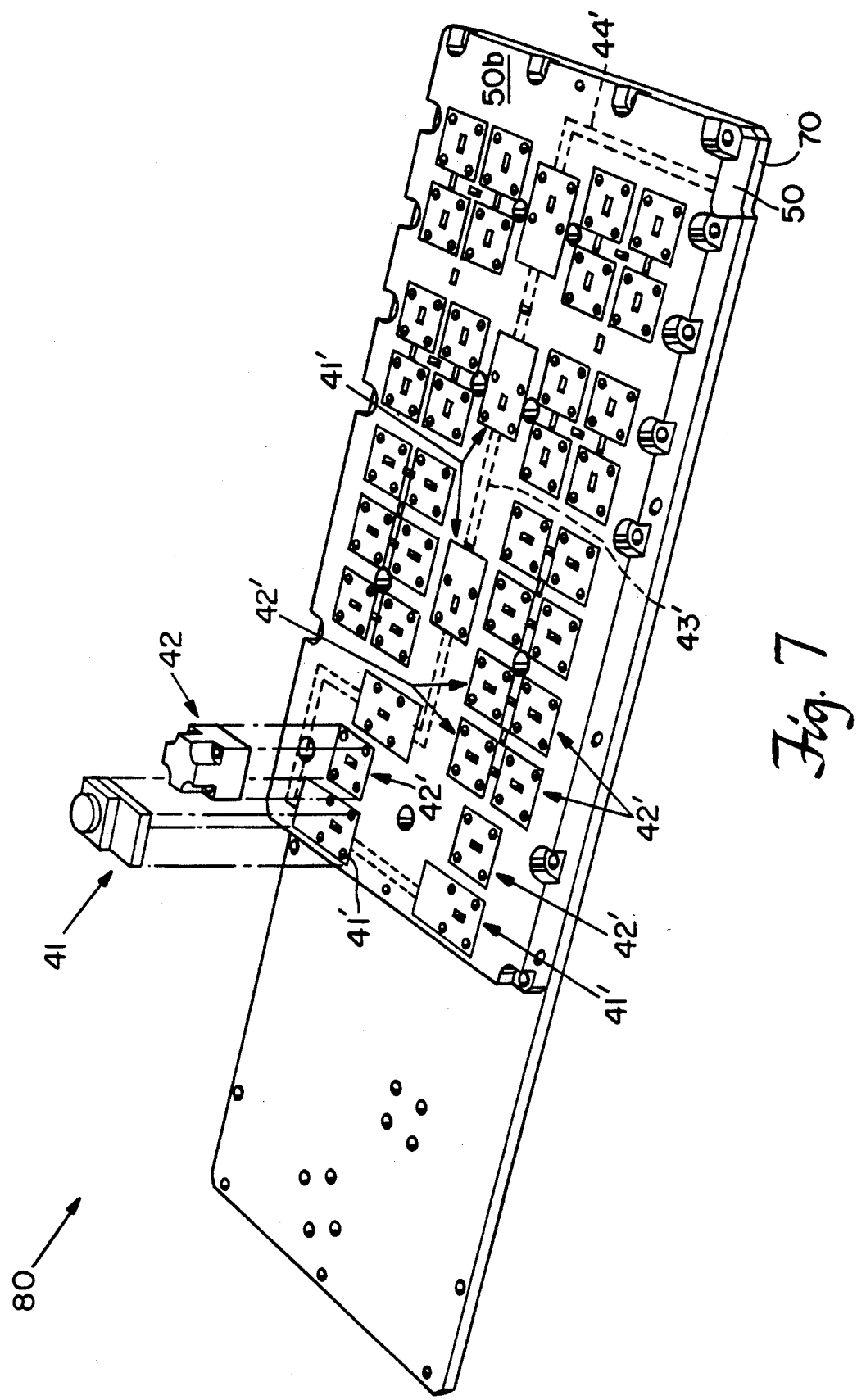
FIG. 7 is a perspective view of a combiner plate having circulator/isolator modules and diode modules disposed thereon in accordance with a further aspect of the present invention.

Referring now to FIG. 7, an assembled combiner plate 80 is shown having a diode amplifier module 42 coupled to surface 50a of top plate 50. Here the diode amplifier module 42 is any conventional module having an IMPATT diode disposed with associated RF chokes, absorbers, transformer members, as well as a heat sink (all not shown), as is commonly known. The IMPATT diode in module 42 is fed a DC bias signal provided from a voltage regulator circuit board (not shown) disposed on the module 42. In response to such a DC bias and an input RF signal fed to the modules 42, the IMPATT converts a portion of such DC energy to RF energy at here a frequency of 44 GHz. The converted RF energy is fed to a waveguide (not shown) disposed within the module 42. The module 42 has a waveguide port (not shown) disposed on a bottom portion thereof which mates with the corresponding aperture 56 provided in the upper plate of the composite combiner plate 80. Surface 50b supports a plurality of diode modules 42 here 32 of such modules 42. Each of diode modules 42 are disposed on corresponding footprints here denoted as 42' on plate 50.

Likewise, the circulator/isolator combination (here isolator 41a and circulator 41b of FIG. 2), is disposed over the upper plate 50 and has a aperture corresponding in size to aperture 56 disposed in plate 50, as shown. Surface 50b further supports a plurality (here 6) of circulator/isolator modules 41. Each of the circulator/isolator modules 41 are disposed over footprints 41", as also depicted on the plate 50. Footprints 44' of conventional sections of waveguide (not shown) are depicted on the upper surface 50b of plate 50 and are used to interconnect the isolator/circulator members 41 and thus interconnect the stages 40a–40f of the amplifier 24. The modules are mounted to the plate using machine screws provided through holes (not shown for module 41) in the respective modules 41 and 42.

Figure 8:
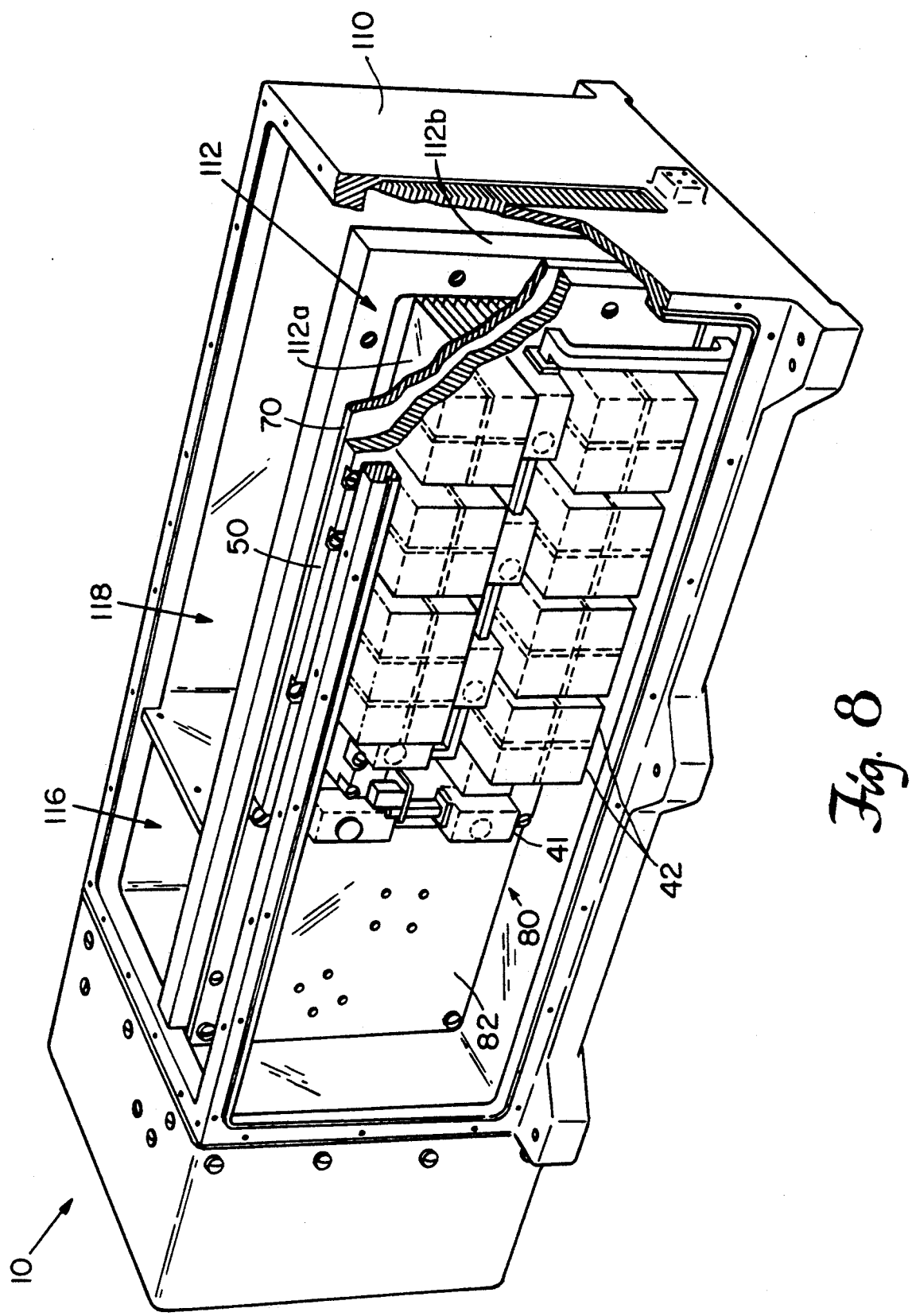
FIG. 8 is an isometric view of a combiner plate generally described in connection with FIGS. 3–7 including amplifier and isolator/combiner modules disposed in a frame having an integral heat sink disposed over a back surface of the plate thereof in accordance with a further aspect of the present invention.

Referring now to FIG. 8, the combiner plate 80 having diode modules 42 and isolator/circulator modules 41 mounted thereover as was described in conjunction with FIG. 7, as well as the other associated components (not shown) of the solid state transmitter 10, such as the frequency quadrupler, x-band isolator, x-band preamplifier, and diode detector circuits which are generally provided for in region 82 is disposed within a frame or housing 110. Housing 110 has disposed behind the combiner plate 80, against the bottom surface of bottom plate 70, a heat sink 112 here a plurality of fins 112a of thermally conductive material which is disposed on a support plate 112b and disposed against the back of the lower combiner plate 70, as shown. Alternatively, the heat sink support plate may be disposed against the back surface of plate 70. Any conventional heat sink arrangement can now be used with this approach. By placing the heat sink behind the bottom surface 70b of the combiner plate 80, a more direct heat sink path is provided to more easily remove heat from the assembly. The housing 110 has regions 116, 118 used to receive additional components such as the power supply, as well as other circuits which might be useful in the solid state transmitter.

The bottom plate includes cut outs that are provided for tool access for the cone retention hardware. This surface, however, is also thermal interface with the heat sink or heat exchanger. The cutouts reduce the amount of surface area in contact with the heat exchanger and curtails thermal performance. Moreover, the parting line or interface which separates the upper and lower plates presents an additional thermal impedance which also reduces thermal performances and provides a critical alignment in that the location of the interface must coincide for optimum electrical performance with the location of the minimum current distribution through the waveguide. The cones must also be properly aligned at the junctions of each one of the magic Ts, as required. Generally, the assembly of cones into the plates is a labor intensive operation.

Referring now to FIGS. 9, 9A, and 9B an alternate embodiment of the present invention is shown to include a mandrel 110 or positive blank provided from a material which has the ability to be dimensionally stable, hold close tolerances, and become a sacrificial member at the conclusion of a casting process. The mandrel 110 is here machined from bar stock of aluminum, for example, and provides a pattern 113 corresponding to waveguide sections, as generally shown, and which would correspond to a desired configuration of the waveguide members. The mandrel 110 is arranged to create a network of waveguide paths here in particular configured as magic T's 116, 117, 118, 119 of any desired configuration and orientation as shown. Each of patterned section 113 of the mandrel is further machined to have mounting pins 124 (FIG. 9A) protruding from each of the ports of the mandrels. The mounting pins 124 are used to mount each one of the individual mandrels to a composite plate 111 having corresponding through holes 111a to receive the pins 124 and thus provide each of the patterned sections 113 of the mandrel 110 in a predetermined arrangement. Furthermore, the patterned sections 113 are preferably provided with machined apertures 122. The apertures 122 are machined by techniques such as electric discharge machining using a electrode having the desired shape of the apertures 122 (i.e. cone-shaped). The apertures 122 are provided into each one of the patterned sections 113 which forms a magic T to provide cone-shaped apertures 122 in the junctions of the magic T in a precisely defined locations. Each of the patterned regions 113 are thus mounted to the plate 111. A heat sink pattern 130 having fins 132 is also mounted to the plate behind the mandrel 110 such that the mounting plate 111 includes the mandrel 110 affixed to the inner surface thereof and mounted in a predetermined configuration, and the heat sink plate 130 having pins 126 with keys to permit appropriate spacing between the mandrel of the waveguide combiner section and the heat sink 130. The assembly is then placed in a casting container and molted metal such as copper is poured into the region between the plate 111 and the mandrel 130 for the heat sink.

Thus, here the mandrel 110, heat sink pattern 130 and pins 124, 126, as well as, plate 111 are comprised of aluminum, whereas the casting will be a different material such as copper. After the part has been cast, the aluminum plate 111, the heat sink pattern 130, and mandrel 110 are removed by dissolving the dissimilar metal here aluminum in an appropriate material such as sodium hydroxide. Left behind is a casting having passages disposed through the interior portion of the plate which correspond to the mandrel 110. These passageways are here rectangular shapes, grooves, or recesses (not shown) provided within the interior of the plate and which provide functionally the same arrangement described in conjunction with FIGS. 3–6F.

Thus, after the combiner plate is cast and the mandrels removed from the combiner plate, an integral combiner plate is provided without the interfacial region between upper and lower plates, as well as with an integral formed heat sink disposed on the back surface of the plates. Further, the cone distribution members are also integrally formed into the magic Ts since the apertures which were electrical discharged machined in the mandrels are now filled with the cast material such as copper. This provides a monolithic structure which eliminates the detrimental thermal interfaces of the arrangement shown in FIG. 6. Moreover, since the waveguide members are cast in place and thus there is no interfacial layer within the waveguides, alternate arrangements of the magic Ts may be provided. For example, the magic Ts may be configured such that the E-plane arms of the combiner can be used to feed the microwave energy and the H-plane arms of the magic Ts can be terminated in characteristic impedances.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A method of providing a waveguide component comprises the steps of:
   providing a mandrel corresponding to a positive blank of a waveguide configuration, said mandrel comprised of a dissolvable material;
   casting a plate of a different material about said mandrel; and
   dissolving said mandrel to provide the plate having a first surface with a plurality of apertures disposed in said first surface through a portion of said plate and with an interior portion of said plate having a plurality of passages with portions of said passages aligned over the apertures provided in the first portion of the plate and with said passages disposed to provide waveguide regions.

2. The method, as recited in claim 1, wherein said providing step further comprising the step of:
   providing a second mandrel corresponding to a positive blank of a heat sink, said second mandrel comprised of a sacrificial material;

said casting step further comprising the step of casting said heat sink member and plate about the mandrels; and said dissolving step further comprises the step of dissolving said mandrels to provide the plate and a heat sink member comprised of a plurality of longitudinal fins disposed over a second surface of said plate.

* * * * *